United States Patent
Lee

(10) Patent No.: US 8,223,320 B2
(45) Date of Patent: Jul. 17, 2012

(54) EXPOSING METHOD USING VARIABLE SHAPED BEAM, AND PATTERN FORMING METHOD USING THE SAME

(75) Inventor: Ho-june Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 810 days.

(21) Appl. No.: 12/314,319

(22) Filed: Dec. 8, 2008

(65) Prior Publication Data

US 2009/0168043 A1 Jul. 2, 2009

(30) Foreign Application Priority Data

Dec. 31, 2007 (KR) ........................ 10-2007-0141646

(51) Int. Cl.
*G03B 27/32* (2006.01)
*G03B 27/68* (2006.01)

(52) U.S. Cl. ........................................... 355/77; 355/52

(58) Field of Classification Search ............ 355/52, 355/53, 55, 77; 250/310, 492.22; 716/21, 716/120–121

See application file for complete search history.

(56) References Cited

U.S. PATENT DOCUMENTS

| 6,721,939 | B2 * | 4/2004 | Wang et al. ............ 430/30 |
| 2002/0115020 | A1 | 8/2002 | Yang | |
| 2006/0060781 | A1 * | 3/2006 | Watanabe et al. ......... 250/310 |

FOREIGN PATENT DOCUMENTS

| JP | 2007-033282 | 2/2007 |
| KR | 10-2001-0055912 | 7/2001 |
| KR | 10-0594225 | 6/2006 |

OTHER PUBLICATIONS

English language Abstract 10-2002-0053258 dated Jul. 5, 2002.
Office Action dated Jan. 5, 2012 for corresponding Chinese Patent Application No. 200810190345.2.

* cited by examiner

*Primary Examiner* — Hung Henry Nguyen
(74) *Attorney, Agent, or Firm* — Harness, Dickey & Pierce, P.L.C.

(57) ABSTRACT

Provided is an exposing method using a variable shaped beam that may minimize a critical dimension (CD) distribution and a mean to target (MTT) difference generated during a process by correcting CD linearity of the design CD of a circuit pattern, and a pattern forming method using the exposing method. In the exposing method, a determination is made as to whether the design size of a beam shot used to expose a circuit pattern is less than a value, or greater than the value. If the design size is greater than the value, the size of the beam shot may be linearly corrected. When the design size is less than the value, the size of the beam shot may be non-linearly corrected.

18 Claims, 8 Drawing Sheets

EXPOSING METHOD USING VARIABLE SHAPED BEAM, AND PATTERN FORMING METHOD USING THE SAME

PRIORITY STATEMENT

This application claims the priority under 35 U.S.C. §119 to Korean Patent Application No. 10-2007-0141646, filed on Dec. 31, 2007, in the Korean Intellectual Property Office, the entire contents of which are incorporated herein by reference.

BACKGROUND

1. Field

Example embodiments relate to an exposing method for semiconductor device manufacturing, and more particularly, to an exposing method using a variable shaped beam capable of correcting the critical dimension (CD) linearity of the variable shaped beam, and a pattern forming method using the same.

2. Description of Related Art

As semiconductor device become more integrated, the linewidth of a pattern becomes finer. It becomes difficult to accurately form a pattern with a fine linewidth on a wafer using a photolithography process. A variety of exposure technologies have been proposed to form such a pattern with a fine linewidth on a wafer using the photolithography process. Electron beam lithography using an electron beam may be used, as one such exposure method. The electron beam lithography technology has excellent resolution and accuracy, as compared to other exposure technologies.

Examples of the electron beam lithography include a Gaussian beam method, a cell projection method, and a variable shaped beam (VSB) method, depending on a beam shape. In lithography technology of the VSB method, the openings of apertures may be arranged to partially overlap each other, an electron beam may pass through the overlapping portions of the openings, and a shaped electron beam may be illuminated onto a photoresist layer on a substrate to form photoresist patterns on the substrate. Since the lithography technology of the VSB method may divide a design circuit pattern into a plurality of rectangular shots having various sizes that may be used to perform an exposure, it is important to generate electron beams having the same sizes as those of the divided circuit patterns.

Measurement of the CD of a generated beam shot may indicate that a CD difference may be created between the CD of the design beam shot and the CD of the generated beam shot, depending on the control accuracy of electron beam exposure equipment and the process conditions. Therefore, it may be difficult to accurately form desired photoresist patterns on the substrate. To accurately form the desired photoresist patterns, a CD difference between the CD of the design beam shot and the CD of the generated beam shot may be corrected. Particularly when the design CD of a circuit pattern to be formed may be below a value, a difference between the CD of the design beam shot and the CD of the generated beam shot may increase even more, due to a limit of resist resolution.

FIG. 1 is a graph illustrating linearity of a circuit pattern with respect to a CD change when circuit patterns having various CDs are exposed using an electron beam exposure equipment, according to the conventional art. Here, the CDs of the circuit patterns are interpreted to mean design CDs. Referring to FIG. 1, as the design CD of the circuit pattern varies, a mean to target (MTT) may change. When the design CD is greater than a value, for example when the design CD is in a range that is greater than 300 nm (as shown by Section A), a linear relationship exists between MTT and design CD. On the other hand, when the design CD is in a range that is less than 300 nm (as shown by Section B), a non-linear relationship exists between MTT and design CD. Additionally, as the design CD of the circuit pattern grows smaller, the linearity between MTT and design CD deteriorates further.

Circuit patterns may mean photoresist patterns formed on a substrate such as a quartz substrate, or photoresist patterns formed on a semiconductor wafer. The design CD may mean the target CD of the photoresist patterns to be formed on the substrate, or the target CD of the photoresist patterns to be formed on the wafer. The generated CD may mean a CD measured on the photoresist patterns that are actually formed on the substrate, or the wafer after an exposure process. The linearity may mean a degree by which a difference between the design CD and the measured CD of the circuit patterns changes according to the design CD. The linearity may be considered excellent when a CD difference between the design CD and the generated CD is constant as the design CD changes. Therefore, to accurately form the designed circuit patterns on the substrate, the CD linearity may be corrected by controlling the shot size of an electron beam in an electron beam exposing method.

FIG. 2 is a graph showing a method of controlling the shot size of an electron beam to correct CD linearity. Referring to FIG. 2, in an ideal case, the shot output (the CD of a generated beam shot) of an electron beam exposed on a substrate or a wafer coincides with the shot input (the CD of a design beam shot) of an electron beam generated by electron beam exposure equipment, as shown by line 21. In this case, a CD difference between the CD of the design beam shot and the CD of the generated beam shot does not exist even when the CD of the circuit patterns change. Accordingly, the CD of the beam shot does not need to be corrected.

In example embodiments where shot output increases at a constant rate, as shot input increases the shot gain of an electron beam may be controlled to correct the CD of the beam shot, as shown by line 23. When shot output changes at a constant rate, as shot input increases the shot offset of an electron beam may be controlled to correct the CD of the beam shot, as shown by line 25. The CD linearity of the beam shot in a range where the MTT linearly changes (section A of FIG. 1) may be corrected using the shot offset correcting method, or the shot gain correcting method. However, when the CD linearity of the beam shot is corrected using the shot gain correcting method or the shot offset correcting method, in a range where the MTT non-linearly changes (section B of FIG. 1), an error is generated as illustrated in FIG. 3. This is because the shot gain correcting method and the shot offset correcting method are linear correcting methods.

Therefore, when the design CD of the circuit patterns is greater than a value, the CD of the beam shot may be linearly controlled using the shot gain correcting method or the shot offset correcting method to correct CD linearity. On the other hand, when the design CD of the circuit patterns is less than the value, the CD of the beam shot may be non-linearly corrected. In example embodiments, when the design CD of the circuit patterns is less than the value, the CDs of the beam shot with respect to the design CD of the circuit patterns may be generated as a table, and the table for the CDs may be directly applied in correcting the CD linearity. Alternatively, the CD of the beam shot may be non-linearly controlled using a rule obtained from the table to correct CD linearity. A method of correcting the CD linearity according to example embodiments, will be described herein, in detail.

SUMMARY

Example embodiments provide an exposing method using a variable shaped beam capable of non-linearly correcting the CD linearity of the variable shaped beam caused by a CD change of a circuit pattern, and a pattern forming method using the same.

According to example embodiments, there is provided an exposing method that may use a variable shaped beam, the method comprising: judging whether a design size of a beam shot that may expose a circuit pattern is less than a value, or greater than the value; if the design size is greater than the value as a result of the judgment, linearly correcting a size of the beam shot; and if the design size is less than the value as a result of the judgment, non-linearly correcting the size of the beam shot. The value may be a predetermined value, or a desired value, that may represent a threshold value where the design CD transitions from a linear to a non-linear relationship as compared to the change in MTT, as shown in FIG. 1.

An example embodiment where the design size may be less than the value may comprise example embodiments where at least one of a design size in a first direction (X-axis direction) and a design size in a second direction (Y-axis direction) may be less than a value.

An example embodiment where one of a design size in the X-axis direction and a design size in the Y-axis direction may be less than a value may comprise an example embodiment where a mean to target (MTT) for one of the design size in the X-axis direction and the design size in the Y-axis direction exists in a non-linearly changing section.

The non-linear correction of the size of the beam shot may comprise: setting in advance a correction amount of the beam shot on the basis of the design size in the X-axis direction and the design size in the Y-axis direction; and individually controlling the design sizes of the beam shot in the X-axis direction and the Y-axis direction, on the basis of the correction amount.

The setting in advance of the correction amount may comprise tabulating the correction amount for each design size in the X-axis direction and each design size in the Y-axis direction, or tabulating corrected sizes of the beam shot in the X-axis direction and corrected sizes in the Y-axis direction, on the basis of the correction amount.

The individual controlling of the design sizes in the X-axis direction and the Y-axis direction may comprise, if the design size in the X-axis direction is smaller than the design size in the Y-axis direction, correcting the design size in the Y-axis direction to one of a (+) Y-axis direction and a (−) Y-axis direction.

The method may further comprise, after the individual controlling of the design sizes in the X-axis direction and the Y-axis direction, shifting a position of the beam shot to the other of the (+) Y-axis direction and the (−) Y-axis direction.

The individual controlling of the design sizes in the X-axis direction and the Y-axis direction may comprise, if the design size in the Y-axis direction is smaller than the design size in the X-axis direction, correcting the design size in the X-axis direction to one of a (+) X-axis direction and a (−) X-axis direction.

The method may further comprise, after the individual controlling of the design sizes in the X-axis direction and the Y-axis direction, shifting a position of the beam shot to the other of the (+) X-axis direction and the (−) X-axis direction.

The individual controlling of the design sizes in the X-axis direction and the Y-axis direction may comprise, if a design critical dimension (CD) in a first direction and a design CD in a second direction are the same, correcting a generated size of the beam shot to a (+) X-axis direction or a (−) X-axis direction, and a (+) Y-axis direction or a (−) Y-axis direction.

The method may further comprise, after the individual controlling of the design sizes in the X-axis direction and the Y-axis direction, shifting a position of the corrected beam shot to the (+) X-axis direction or the (−) X-axis direction, and the (+) Y-axis direction or the (−) Y-axis direction.

According to example embodiments, there may be provided an exposing method using a variable shaped beam, the method comprising: measuring design sizes in an X-axis direction and a Y-axis direction perpendicular to the X-axis direction of a beam shot that may expose a circuit pattern; obtaining measured sizes in the X-axis direction and the Y-axis direction of the beam shot; setting in advance a correction amount of the beam shot on the basis of the design sizes in the X-axis direction and the Y-axis direction of the beam shot, and the generated sizes in the X-axis direction and the Y-axis direction of the beam shot; and individually controlling the measured sizes in the X-axis direction and the Y-axis direction on the basis of the correction amount.

The setting in advance of the correction amount may comprise tabulating the correction amount for each design size in the X-axis direction and each design size in the Y-axis direction, or tabulating corrected sizes in the X-axis direction and corrected sizes in the Y-axis direction of the beam shot on the basis of the correction amount.

The individual controlling of the measured sizes may comprise, if a measured CD difference in the X-axis direction is sufficiently small, correcting the measured size in the Y-axis direction, which is perpendicular to the X-axis direction, on the basis of a CD difference in the Y-axis direction, and if a measured CD difference in the Y-axis direction is sufficiently small, correcting the measured size in the X-axis direction, which is perpendicular to the Y-axis direction, on the basis of a CD difference in the X-axis direction. The term "sufficiently small" signifies that the measured CD difference is negligible.

The method may further comprise, after the individual controlling of the measured sizes, shifting a position of the beam shot to one of the X-axis direction and the Y-axis direction.

The method may further comprise, if the measured size in the X-axis direction of the beam shot is linearly corrected, shifting the position of the beam shot to one of a (+) X-axis direction and a (−) X-axis direction, and if the measured size in the Y-axis direction of the beam shot is linearly corrected, shifting the position of the beam shot to one of a (+) Y-axis direction and a (−) Y-axis direction.

The individual controlling of the measured sizes may comprise, if a measured CD difference in the X-axis direction and a measured CD difference in the Y-axis direction may be the same, correcting the measured size in the X-axis direction and the measured size in the Y-axis direction on the basis of the measured CD difference in the X-axis direction and the measured CD difference in the Y-axis direction, respectively.

The method may further comprise, after the individual controlling of the measured sizes comprises, shifting a position of the beam shot to the X-axis direction and the Y-axis direction.

According to example embodiments, there may be provided a pattern forming method using a variable shaped beam, the method comprising: measuring design sizes in an X-axis direction and a Y-axis direction perpendicular to the X-axis direction of a beam shot that may expose a circuit pattern; obtaining measured sizes in the X-axis direction and the Y-axis direction of the generated beam shot; setting in advance a correction amount of the beam shot on the basis of the design sizes in the X-axis direction and the Y-axis direction of the beam shot, and the measured sizes in the X-axis direction and the Y-axis direction of the generated beam shot; non-linearly correcting the measured size in at least one of the X-axis direction and the Y-axis direction on the basis of the correction amount of the beam shot; and illuminating the corrected beam shot onto a photoresist layer of a substrate.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Figure 1:
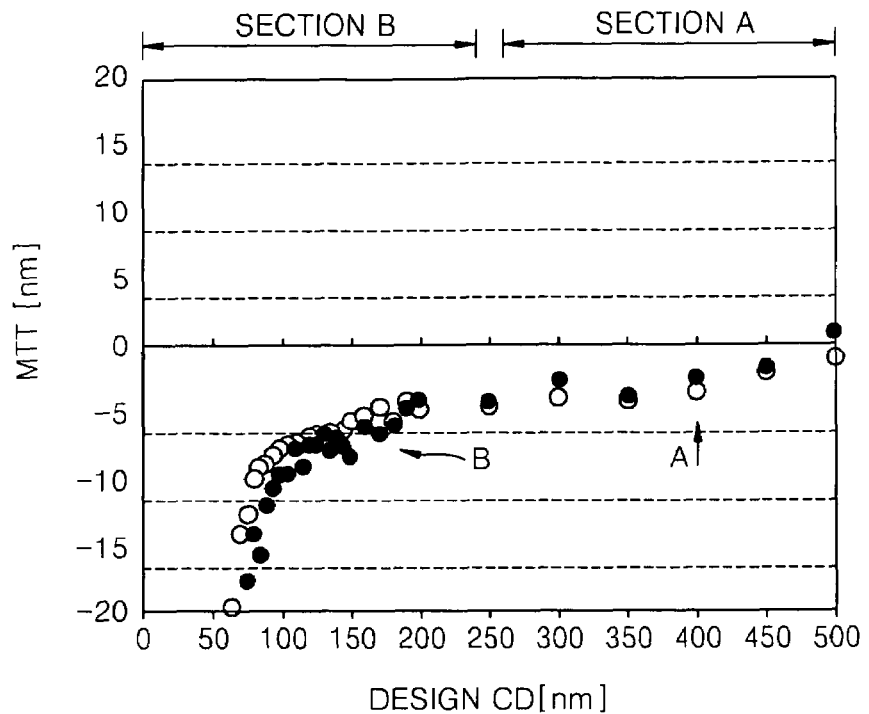
FIG. 1 is a conventional graph illustrating linearity of a circuit pattern with respect to a CD change where circuit patterns having various CDs are exposed using electron beam exposure equipment.
Figure 2:
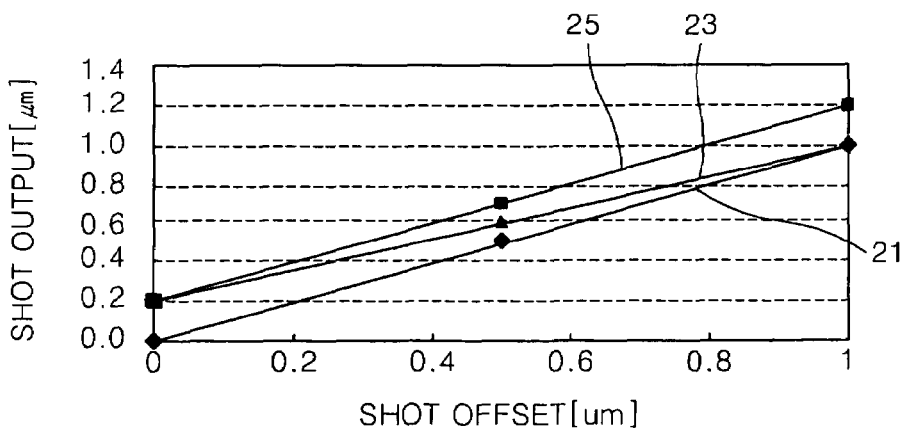
FIG. 2 is a conventional graph explaining a method of correcting CD linearity.
Figure 3:
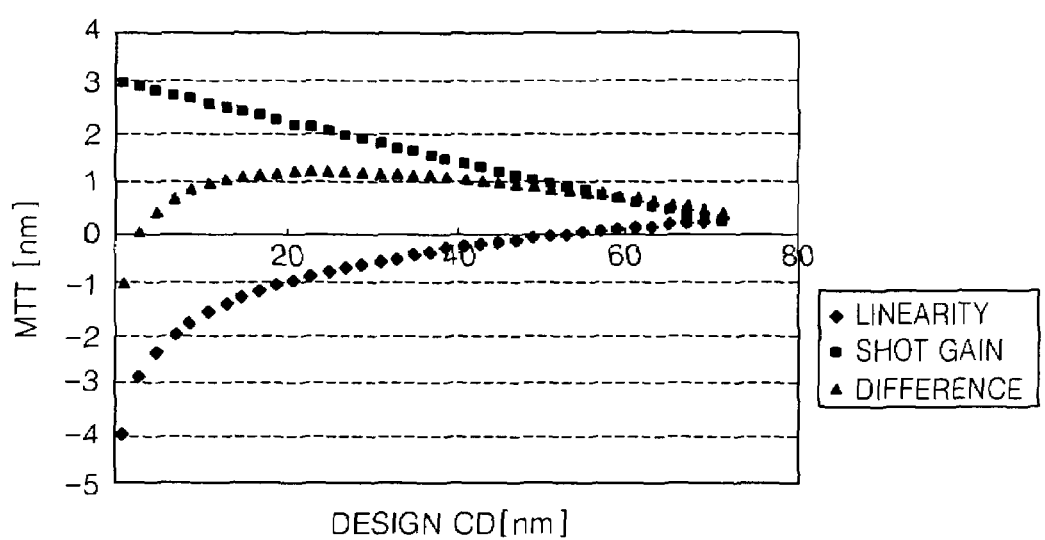
FIG. 3 is a conventional graph illustrating errors generated when the linearity of a beam shot is corrected using a linear correcting method in a non-linear range.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 4:
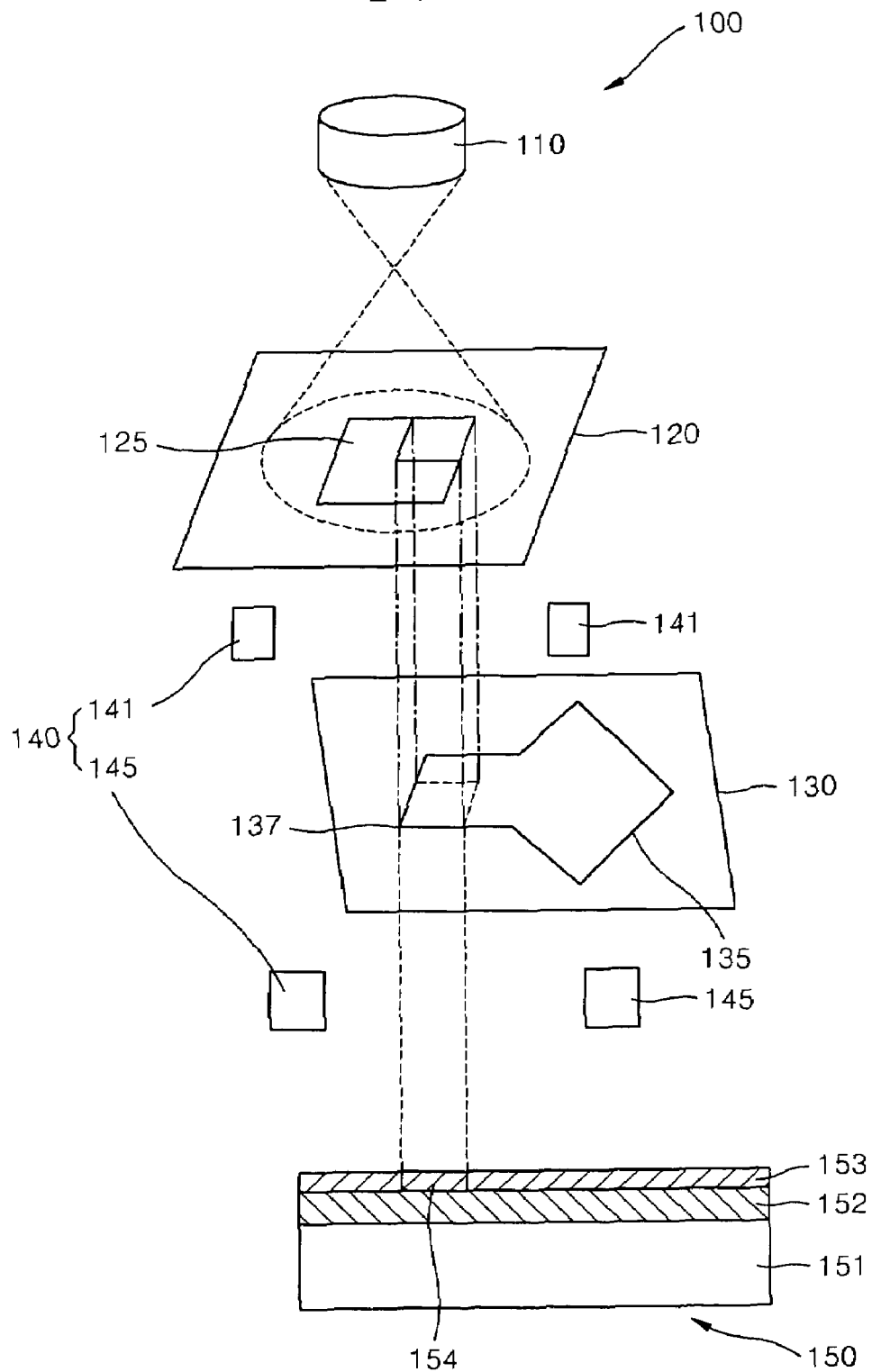
FIG. 4 is a view illustrating the construction of a variable shaped beam generator generating a variable shaped beam, according to example embodiments.

FIG. 4 illustrates the construction of a variable shaped beam generator that may generate a variable shaped beam according to example embodiments. The variable shaped beam generator 100 may include an electron beam generator 110, a first aperture 120 with a first opening 125, and a second aperture 130 with a second opening 135. An electron beam may be generated by the electron beam generator 110. The electron beam may pass through the first opening 125 of the first aperture 120 and may be shaped as a quadrangular electron beam. The quadrangular electron beam that may pass through the first aperture 120 may pass through the second opening 135 of the second aperture 130 and may be shaped as an electron beam having a predetermined size by an overlay of the first opening 125 of the first aperture 120 and the second opening 135 of the second aperture 130.

The variable electron beam generator 100 may further include a deflector 140 deflecting the electron beam. The deflector 140 may include shaping deflectors 141 and position deflectors 145. The shaping deflectors 141 may deflect the electron beam shaped by the first aperture 120 such that the electron beam may pass through the second opening 135 of the second aperture 130. The position deflectors 145 may deflect the position of the electron beam that may pass through the second aperture 130 such that the electron beam may be accurately illuminated onto a portion 154 of a photoresist layer 153 to be exposed.

Figure 5:
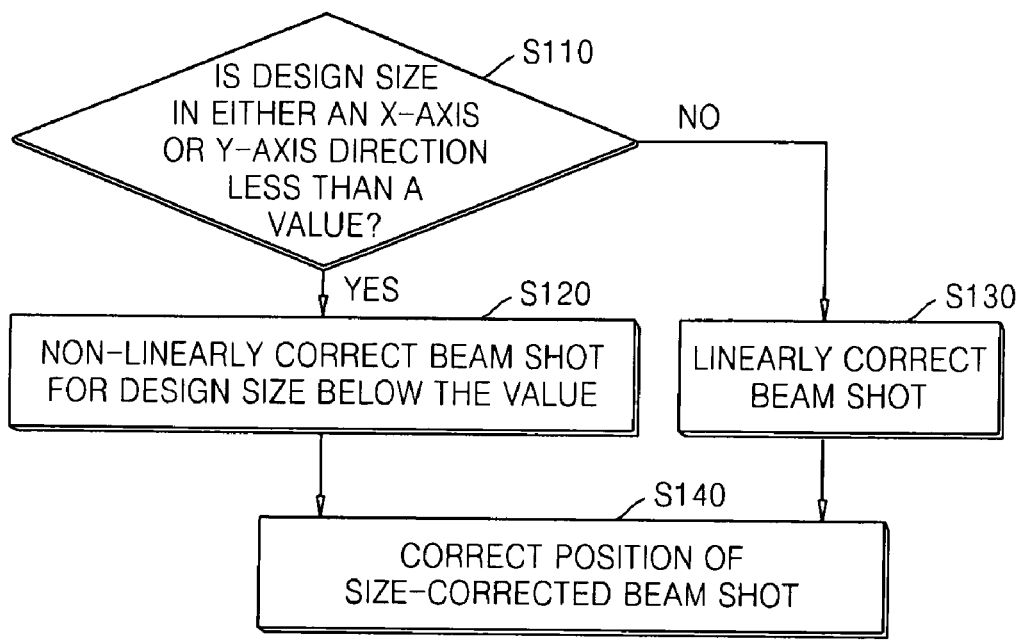
FIG. 5 is a flowchart explaining an electron beam exposing method using the variable shaped beam generator of FIG. 4, according to example embodiments.

FIG. 5 is a flowchart showing an electron beam exposing method using the variable shaped beam exposure equipment 100 of FIG. 4 according to example embodiments. As shown in the figure, in method operation S110 a determination is made as to whether a design size in either the X-axis or Y-axis direction is below a value. This value may be a predetermined value, representing a threshold value where the design CD changes from a linear to a non-linear relationship as compared to the change in MTT, as shown in FIG. 1.

If it is determined in operation S110 that a design value is below a value in either the X-axis or Y-axis direction, then the beam shot may be non-linearly corrected with regard to the design size that is below the value, as shown in operation S120. It should be noted that a design size may be below a value, in both the X-axis and Y-axis direction, in which case both sizes may be non-linearly corrected.

If it is determined in operation S110 that a design value is not below a value in either the X-axis or Y-axis direction, then the beam shot may be linearly corrected, as shown in operation S130.

As shown in operation S140, the position of the size-corrected beam shot may then be corrected in order to correct for a shift in a position of a generated beam shot, as described in more detail below.

Figure 6:
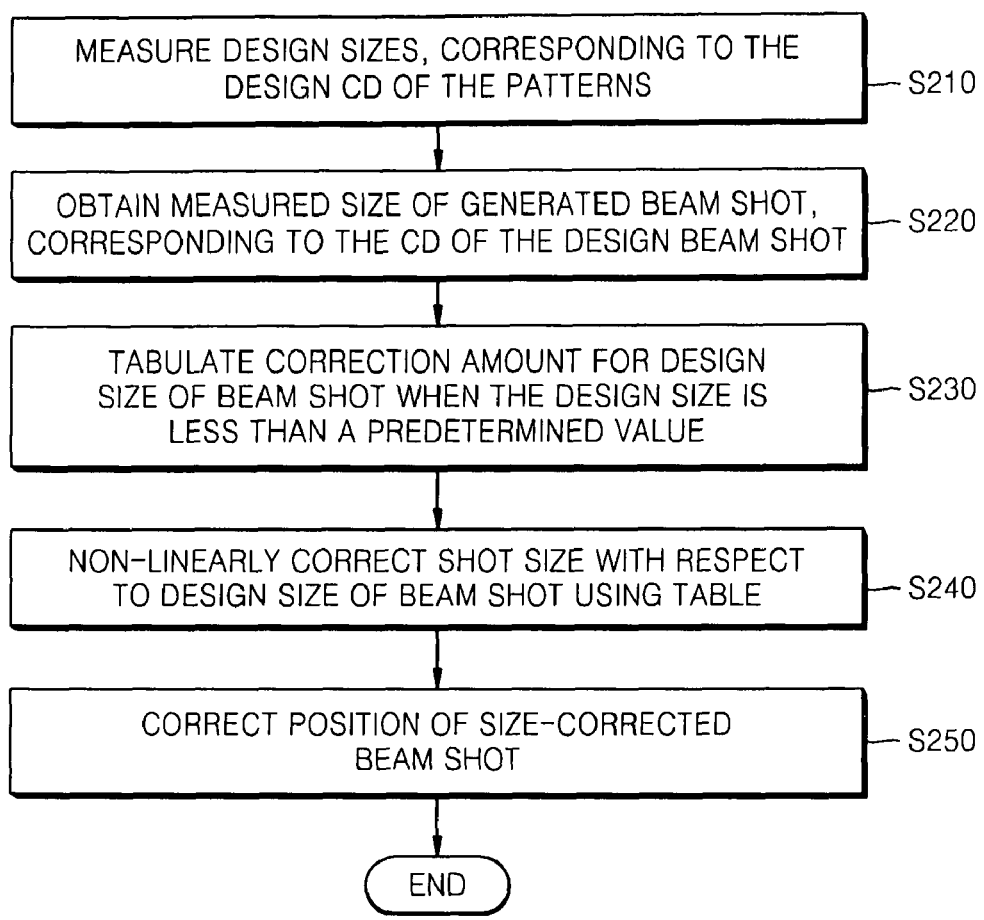
FIG. 6 is a flowchart explaining an electron beam exposing method using the variable shaped beam generator of FIG. 4, according to another example embodiment.
Figure 7:
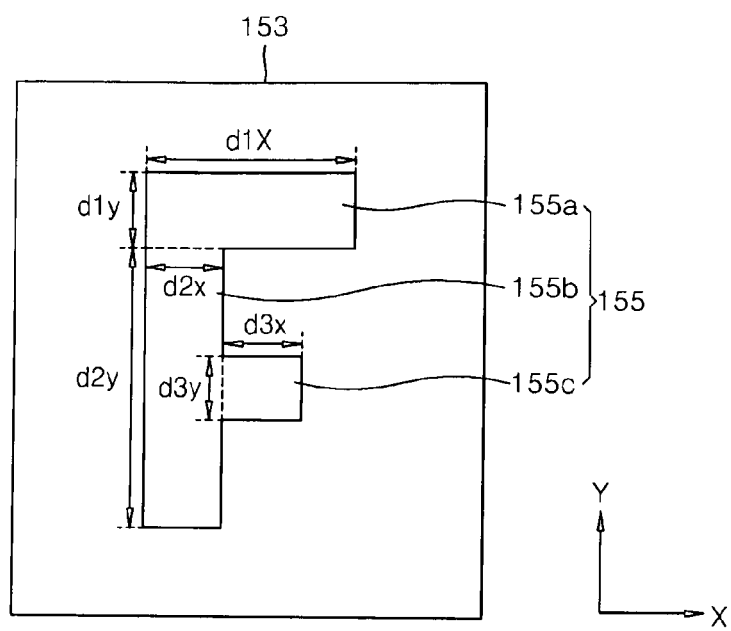
FIG. 7 is a view illustrating an example of a circuit pattern to be exposed using the electron beam exposing method of FIGS. 5 and 6, according to example embodiments.

FIG. 6 is a flowchart showing an electron beam exposing method using the variable shaped beam exposure equipment 100 of FIG. 4 according to another example embodiment. FIG. 7 illustrates a circuit pattern to be exposed using the electron beam exposing method of FIGS. 5 and 6. For purposes of this example, it is assumed that a circuit pattern 155 (as shown in FIG. 7) which is to be exposed using the electron beam exposing method is a character in the shape of an "F", such that the circuit pattern 155 may be divided into a plurality of patterns 155a, 155b, and 155c having different design CDs, respectively. In this example, a beam shot is illuminated three times, in order to perform the overall exposure.

The circuit pattern 155 of the photoresist layer 153 may be divided into a plurality of patterns 155a, 155b, and 155c for each shot size of the electron beam. The design sizes of the design beam shots for the respective patterns 155a, 155b, and 155c may then be measured (S210). The design sizes represent the CDs of the beam shots designed to expose patterns 155a, 155b, and 155c, where the sizes of these beam shots coincide with the design CDs of patterns 155a, 155b, and 155c. Subsequently, the measured sizes of the generated beam shots, corresponding to the design beam shots, may be obtained (S220). The measured sizes represent the measured CDs of the generated beam shot that is illuminated on photoresist layer 153 when the photoresist layer 153 is exposed using beam shots with the same design sizes as the design CDs of the patterns 155a, 155b, and 155c.

The design beam shot for the first pattern 155a may have a design size d1x in a first direction, for example, an X-axis direction, and pattern 155a may have a design size d1y in a second direction, for example, a Y-axis direction, perpendicular to the first direction. The design size d1x in the X-axis direction may be greater than the design size d1y in the Y-axis direction. The design beam shot for the second pattern 155b may have a design size d2x in the X-axis direction and a design size d2y in the Y-axis direction. The design size d2x in the X-axis direction may be relatively smaller than the design size d2y in the Y-axis direction. The design beam shot for the third pattern 155c may have a design size d3x in the X-axis direction and a design size d3y in the Y-axis direction. The design size d3x in the X-axis direction may be the same as the design size d3y in the Y-axis direction.

Subsequently, the measured size of the design beam shot in a range where the MTT non-linearly changes may be non-linearly corrected on the basis of the design size. As a method of non-linearly controlling the size of the beam shot, a table of design sizes for respective design beam shots may be generated on the basis of the design size in the X-axis direction and the design size in the Y-axis direction, and the measured size in the X-axis direction and the measured size in the Y-axis direction of the generated beam shot (S230). That is, the size in the X-axis direction and the size in the Y-axis direction of a corrected beam shot for the design size in the X-axis direction and the design size in the Y-axis direction of the beam shot may be generated as a table, as illustrated in Table 1. Referring to Table 1, correction amounts in the X-axis direction and the Y-axis direction of the corrected beam shot may be tabulated when the design sizes in the X-axis direction of the design beam shot are 1000 nm, 500 nm, 300 nm, 200 nm, and 100 nm, and the design sizes in the Y-axis direction are 1000 nm, 500 nm, 300 nm, 200 nm, and 100 nm.

Subsequently, the size of the corrected beam shot to be generated may be non-linearly corrected on the basis of the tabulated correction amount (S240). As shown in Table 1, "10/10" indicates that when the design size in the X-axis direction of a design beam shot is 300 nm and the design size in the Y-axis direction of the design beam shot is 300 nm, the design sizes of the design beam shot should be corrected by 10 nm in the X-axis direction and by 10 nm in the Y-axis direction, so that the corrected sizes in the X-axis direction and the Y-axis direction of a corrected beam shot should be 310 nm and 310 nm, respectively. Therefore, when pattern 155c with a design CD in the X-axis direction of 300 nm and a design CD in the Y-axis direction of 300 nm is exposed, the measured CDs in the X-axis direction and the Y-axis direction of a generated beam shot actually exposed onto a wafer will be 290 nm and 290 nm, respectively. Therefore, to expose the third pattern 155c with design CDs in the X-axis direction and the Y-axis direction of 300 nm and 300 nm, respectively, a corrected beam shot with CDs in the X-axis direction and the Y-axis direction of (300+10) nm and (300+10) nm, respectively, should be used.

"20/10" of Table 1 represents that if the design CDs in the X-axis direction and the Y-axis direction are 300 nm and 200 nm, respectively, the design CDs of the design beam shot should be corrected by 20 nm in the X-axis direction, and 10 nm in the Y-axis direction, such that the corrected CDs of a corrected beam shot should be 320 nm in the X-axis direction and 210 nm in the Y-axis direction. Therefore, to expose the first pattern 155a with design CDs in the X-axis direction and the Y-axis direction of 300 nm and 200 nm, respectively, a corrected beam shot with CDs in the X-axis direction and the Y-axis direction should be 320 nm and 210 nm, respectively. "10/20" represents that when the design CDs in the X-axis direction and the Y-axis direction are 200 nm and 300 nm, respectively, the design CDs of the design beam shot should be corrected by 10 nm in the X-axis direction and 20 nm in the Y-axis direction, such that the corrected CDs of a corrected beam shot should be 210 nm in the X-axis direction and 320 nm in the Y-axis direction. Therefore, to expose the second pattern 155b whose design CDs in the X-axis direction and the Y-axis direction are 200 nm and 300 nm, respectively, a corrected beam shot with CDs in the X-axis direction and the Y-axis direction should be 210 nm and 320 nm, respectively.

TABLE 1

| Design CD (Y-axis) | Design CD (X-axis) | | | | |
|---|---|---|---|---|---|
| | 1,000 | 500 | 300 | 200 | 100 |
| 1,000 | 10/10 | 10/30 | 10/50 | 10/70 | 10/100 |
| 500 | 30/10 | 30/30 | 30/50 | 30/70 | 30/100 |
| 300 | 50/10 | 50/30 | 50/50 | 50/70 | 50/100 |
| 200 | 70/10 | 70/30 | 70/50 | 70/70 | 70/100 |
| 100 | 100/10 | 100/30 | 100/50 | 100/70 | 100/100 |

Figure 8A:
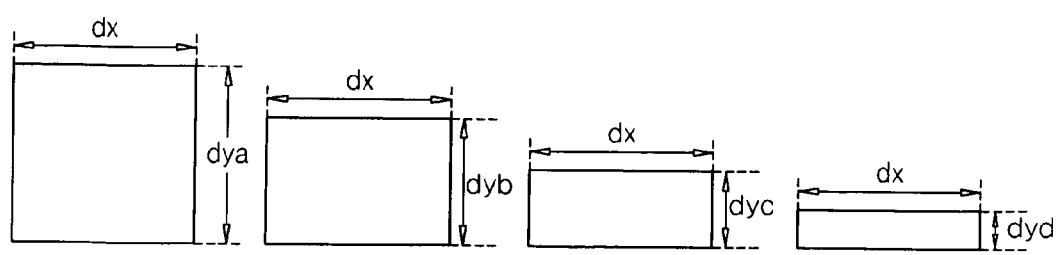
FIG. 8A is a view illustrating various beam shots having a constant design CD in an X-axis direction and changing design CD in a Y-axis direction, according to example embodiments.
Figure 8B:
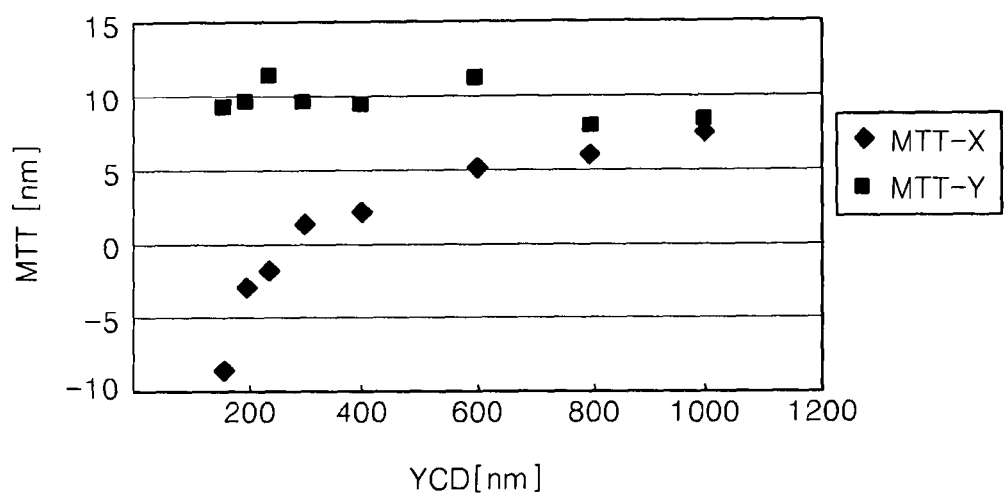
FIG. 8B is a graph illustrating the MTTs in the X-axis direction and the MTTs in the Y-axis direction of the beam shots of FIG. 8A, according to example embodiments.
Figure 8C:
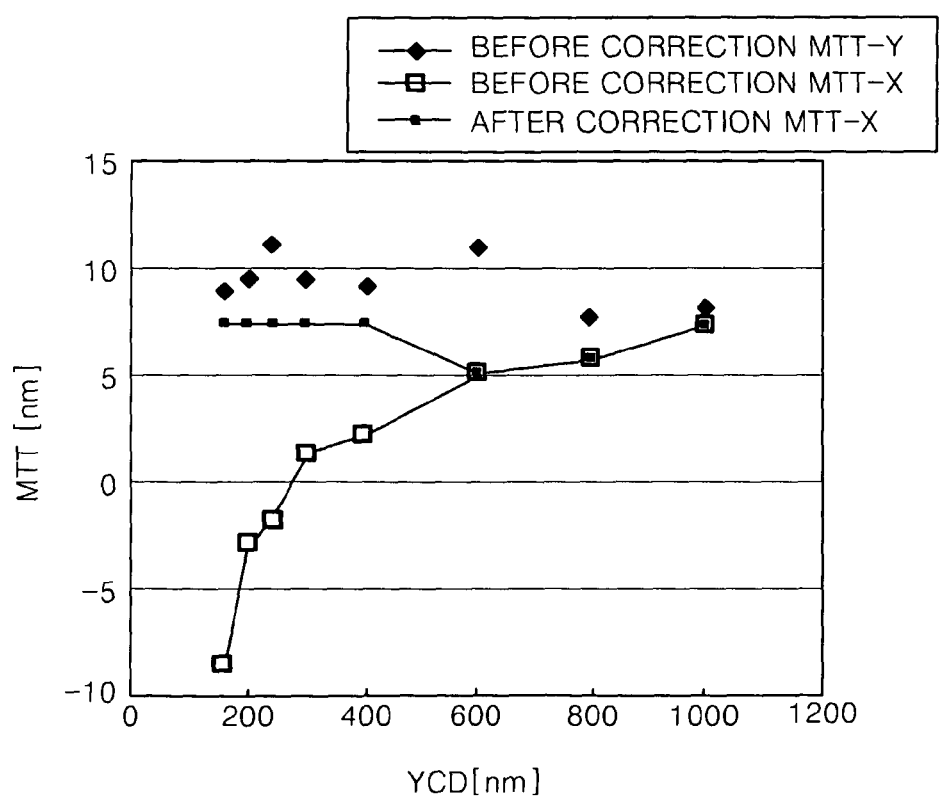
FIG. 8C is a graph illustrating MTTs in the X-axis direction and the Y-axis direction of the beam shot after beam shot CDs in a perpendicular direction are corrected with respect to the design CDs of the beam shots of FIG. 8A, according to example embodiments.

FIG. 8A is a view illustrating various beam shots with a constant design size in an X-axis direction and changing design size in a Y-axis direction. FIG. 8B illustrates the MTTs in the X-axis direction and the MTTs in the Y-axis direction using the beam shots of FIG. 8A. FIG. 8C illustrates MTTs after beam shot sizes in a perpendicular direction may be corrected with respect to the design sizes of the beam shots of FIG. 8A. Referring to FIGS. 8A and 8B, when the design size in the X-axis direction of the design beam shot is constant and the design size in the Y-axis direction of the design beam shot changes, a change in the MTT in the Y-axis direction is small, while the MTT in the X-axis direction changes considerably as the design CD in the Y-axis direction changes.

Therefore, when the design sizes in the X-axis direction and the Y-axis direction of the design beam shot are different from each other, the measured sizes of the generated beam shot may be influenced considerably by the design size in the perpendicular direction of the design beam shot according to the design size in the X-axis direction and the design size in the Y-axis direction. For example, when the MTT of the design size in the X-axis direction of the design size in the X-axis direction and the design size in the Y-axis direction of the design beam shot is in a range that is non-linear, the measured size in the Y-axis direction of the generated beam shot may change much more, as compared to the measured size in the X-axis direction of the generated beam shot. When the MTT of the design size in the Y-axis direction of the design size in the X-axis direction and the design size in the Y-axis direction is in a range that is non-linear, the measured size in the X-axis direction of the generated beam shot may change much more, as compared to the measured size in the Y-axis direction of the generated beam shot.

Therefore, the measured size in the Y-axis direction of the generated beam shot may be corrected with respect to the design size in the X-axis direction of the design beam shot, in a range where the MTT of the design size in the X-axis direction of the design sizes of a pattern to be exposed is non-linear. The measured size in the X-axis direction of the generated beam shot should be corrected with respect to the design size in the Y-axis direction of the design beam shot in a range where the MTT of the design size in the Y-axis direction of the design sizes of the pattern to be exposed is non-linear. Referring to FIG. 8C, when the design size in the X-axis direction and the design size in the Y-axis direction may be different from each other, and the MTT of the design size in the Y-axis direction is non-linear, then the MTT in the X-axis direction may be improved considerably, by correcting the measured size in the X-axis direction, which is perpendicular to the design size in the Y-axis direction of the design beam shot.

Figure 9:
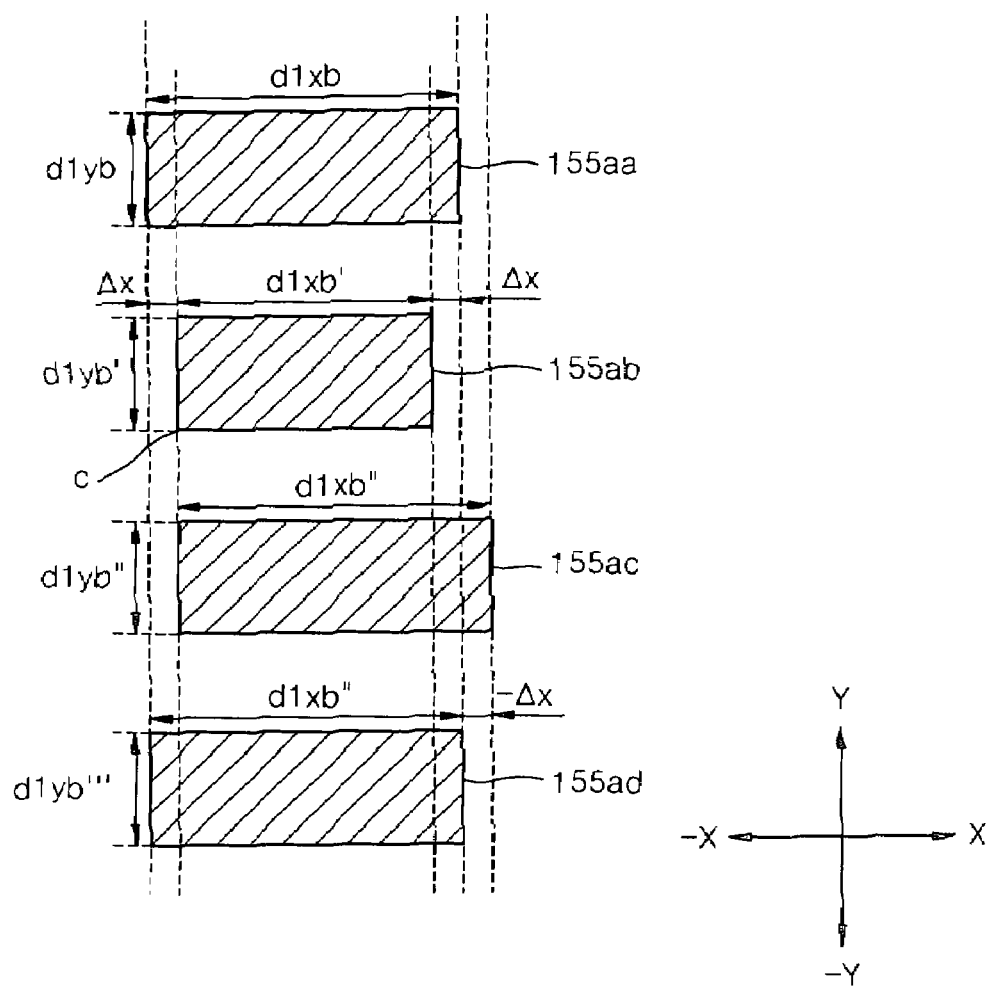
FIG. 9 is a view showing a method of correcting the CD of a generated beam shot where the design CD in the X-axis direction and the design CD in the Y-axis direction of a design beam shot are different from each other, according to example embodiments.

FIG. 9 is a view showing a method of correcting the linearity of a design beam shot exposing, for example the first pattern 155a where the design size in the X-axis direction and the design size in the Y-axis direction may be different from each other. Referring to FIG. 9, a design beam shot 155aa may be designed to expose the first pattern 155a with a design size d1xb in the X-axis direction and a design size d1yb in the Y-axis direction. In an ideal case, while the first pattern 155a may be exposed by the design beam shot 155aa, the design beam shot 155aa may be illuminated onto the photoresist layer 153 of FIG. 1. However, when a beam shot illuminated onto the photoresist layer 153 is actually measured, a generated beam shot 155ab with a design size d1xb' in the X-axis direction and a design size d1yb' in the Y-axis direction may be obtained.

A CD difference 2Δx between a design size and a measured size in the X-axis direction may be obtained, and a CD difference 2Δy between a design size and a measured size in the Y-axis direction may be obtained from the design beam shot 155aa and the generated beam shot 155ab. Therefore, since the measured size d1xb' is noticeably smaller than the design size d1xb in the X-axis direction, the CD difference 2Δx in the X-axis direction may be significant. Because the measured size d1yb' is very similar to the design size d1yb in the Y-axis direction, the CD difference 2Δy in the Y-axis direction may be negligible. This may correspond to a case where design sizes in the X-axis direction and the Y-axis direction are 1000 nm and 100 nm, as shown in table 1.

The measured size of the generated beam shot 155ab may be linearly corrected by controlling the gain or offset of the generated beam shot 155ab on the basis of the obtained CD difference 2Δx. When the CD difference of 2Δx, which is the sum of Δx in a (+) X-axis direction and Δx in a (−) X-axis direction, is linearly corrected to account for the difference between the design CD d1xb of the design beam shot 155aa and the measured CD d1xb' of the generated beam shot 155ab, a CD-corrected beam shot 155ac may obtained. The initially corrected beam shot 155ac has an X-axis direction correction CD d1xb" and a Y-axis direction correction CD d1yb". The corrected beam shot 155ac therefore may have a CD in the X-axis of d1xb" that may be equal to the CD of the design beam shot 155aa of d1xb in the X-axis, and the corrected beam shot 155ac therefore may have a CD in the Y-axis of d1yb" that may be equal to the CD of the design beam shot 155a of d1yb in the Y-axis.

While the generated beam shot 155ab may be linearly corrected to generate the corrected beam shot 155ac, the corrected beam shot 155ac may extend in only one of the (+) X-axis direction and the (−) X-axis direction from the edge of the generated beam shot 155ab, for example. This shifting of the image is caused by the variable shaped electron beam that may be created by an overlay of the first opening 125 of the first aperture 120 and the second opening 135 of the second aperture 130 with reference to an edge 137 of the second opening 135 of the second aperture 130, as illustrated in FIG. 1.

Therefore, even when the generated beam shot 155ab may be illuminated onto the photoresist layer 153 of FIG. 1 as a linearly corrected beam shot 155ac, the corrected beam shot 155ac may not be illuminated onto a portion of the photoresist layer 153 where the first pattern 153a was to be formed, but rather, it may be illuminated onto a position shifted by Δx to the (+) X-axis direction. Even when the corrected beam shot 155ac with the same size as that of the design beam shot 155aa may be illuminated onto the photoresist layer 153, the positioning of the corrected beam 155ac may not be accurately formed, due to this shift of the corrected beam 155ac on the photoresist layer 153.

Therefore, the corrected beam shot 155ac may be shifted by Δx in the (−) X-axis direction, to generate a position-corrected beam shot 155ad. Because the position-corrected beam shot 155ad may be shifted by Δx in the (−) X-axis direction and illuminated onto the photoresist layer 153, an electron beam may be accurately exposed on a position of the photoresist layer 153 where the first pattern 155a may be formed. As described above, when the first pattern 155a, with a design size d1x in the X-axis direction that is greater than the design size d1y in the Y-axis direction, and with a CD difference in the Y-axis direction that may be considered negligible, the measured size in the X-axis direction may be linearly corrected, and then a position correction in the (−) X-axis direction may shift the corrected beam shot 155ac so that the corrected beam shot may correspond to the same CD and position of the design beam shot 155aa.

The second pattern 155b with a design size in the X-axis direction that is different from that in the Y-axis direction, may next be considered. The design size d2x in the X-axis direction may be smaller than the design size d2y in the Y-axis direction, and the MTT of the design size in the X-axis direction may be in a non-linear range. For purposes of an example, the design size in the X-axis direction and the Y-axis direction may be 100 nm and 1000 nm, respectively, as shown in Table 1. Using a beam shot exposing the second pattern 155b, the design size d2y in the Y-axis direction may be greater than the design size d2x in the X-axis direction, and a CD difference between the design size of a design beam shot and the measured size of a generated beam shot in the X-axis direction may therefore be sufficiently small, such that the CD difference in the X-axis direction may be considered negligible. Meanwhile, a CD difference between the design size and the measured size in the Y-axis direction may be significant, such that the CD difference may influence the CD of the design beam shot in the Y-axis direction.

Therefore, when correcting for the second pattern 155b, similar to the correcting method of FIG. 9, a CD difference between the measured size of a generated beam shot and the design size in the Y-axis direction may be obtained. The measured size in the Y-axis direction on the generated beam shot may be linearly corrected to the size in the Y-axis direction of the design beam shot, on the basis of the obtained CD difference in the Y-axis direction. Subsequently, the size-corrected beam shot may be position-corrected to a (+) Y-direction or a (−) Y-direction.

Additionally, a situation where the pattern with a design CD in the X-axis may be the same as the design CD in the Y-axis direction, may be considered. For example, when correcting for the third pattern 155c, design sizes in the X-axis direction and the Y-axis direction may be 300 nm and 300 nm, respectively, as shown in Table 1. Since the design size d3x in the X-axis direction and the design size d3y in the Y-axis direction are the same, the measured size of a generated beam shot may be non-linearly corrected on the basis of the correction amount indicated in Table 1 (S240), and the position of the beam shot may be moved by Δx in one of the (−) X-axis direction and (+) X-axis direction, and moved by Δy in one of the (−) Y-axis direction and (+) Y-axis direction, using the method as illustrated in FIG. 8 (shown in FIG. 5 as operation S250).

As described above, the measured size in the Y-axis direction of the generated beam shot may be corrected with respect to the design size in the X-axis direction of the design beam shot, or the measured size in the X-axis direction of the generated beam shot may be corrected with respect to the design size in the Y-axis direction of the design beam shot, in the range where the MTT may be non-linear, using the correcting method as illustrated in FIGS. 8A, 8B, 8C, and 9. In order to tabulate data of the corrected beam shot, the CD correction of a beam shot in the X-axis direction and the Y-axis direction may be tabulated, or the corrected CDs of the corrected beam shot in the X-axis direction and the Y-axis direction may be tabulated, as shown in Table 1. For non-linearly correcting the beam shot size, tabulated data of the corrected beam shot shown in Table 1 may be used directly, or a predetermined rule may obtained from the tabulated data shown in Table 1 such that a beam shot may be non-linearly corrected using the obtained rule.

After the linearity and the position of the beam shot may be corrected using the above method, corrected beam shots corrected for respective patterns 155a, 155b, and 155c may be illuminated onto the photoresist layer 153 coated on the substrate 151 of FIG. 4, through a reduction lens (not shown). A portion 154 of the photoresist layer 153 exposed by the electron beam may be removed through a developing process to form a photoresist pattern. A light blocking layer 152 formed of Cr may be etched using the photoresist pattern, to form light blocking patterns. The photoresist pattern may be removed so that a mask 150 may be manufactured.

In the exposing method using the variable shaped beam according to example embodiments, when the design size of the circuit pattern is less than a value, beam shot sizes for the design CD of the circuit pattern may be generated as a table, and the table may be directly applied to correcting the beam shot size. Alternatively, the beam shot size for the design CD of the circuit pattern may be non-linearly corrected on the basis of a rule obtained from the table. Therefore, the beam shot size of an electron beam may be properly corrected for each design CD of the circuit pattern, either linearly or non-linearly.

Additionally, the exposing method according to example embodiments may correct a position on which an electron beam may be illuminated after the shot size of the electron beam may be corrected, thereby accurately illuminating the electron beam on the precisely desired position of a photoresist layer. Furthermore, when the design CD of an X-axis direction may be different from the design CD of a Y-axis direction in the circuit pattern, the shot size of the electron beam may be corrected in either the X-axis direction or the Y-axis direction, or both.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method of exposure using a variable shaped beam, the method comprising:
    determining whether a design size of a beam shot is less than a value or greater than the value, the beam shot being used to expose a circuit pattern;
    linearly correcting the size of the beam shot, if the design size is greater than the value; and
    non-linearly correcting the size of the beam shot, if the design size is less than the value,
    wherein the design size less than the value includes the beam shot where at least one of a design size in a first direction and a design size in a second direction is less than the value, the first direction being an X-axis direction and the second direction being a Y-axis direction, and
    wherein the non-linearly correcting comprises, p2 determining a correction amount of the beam shot, in at least one of the X-axis direction and the Y-axis direction, the correction amount being based on the design size, the determining the correction amount occurring in advance of producing a beam shot, and
        controlling the design sizes of the beam shot in the at least one of the X-axis direction and the Y-axis direction, on the basis of the correction amount.

2. The method of claim 1, wherein the at least one of the design size in the X-axis direction and the design size in the Y-axis direction that is less than the value has a mean to target (MTT) value in a non-linearly changing range.

3. The method of claim 1, wherein the determining the correction amount includes tabulating the correction amount for design sizes in the X-axis direction and design sizes in the Y-axis direction.

4. The method of claim 1, wherein the controlling of the design sizes in the X-axis direction and the Y-axis direction comprises:
correcting the design size in the Y-axis direction to one of a (+) Y-axis direction and a (−) Y-axis direction, if the design size in the X-axis direction is smaller than the design size in the Y-axis direction.

5. The method of claim 4, further comprising:
shifting a position of the beam shot to the other of the (+) Y-axis direction and the (−) Y-axis direction.

6. The method of claim 1, wherein the controlling of the design sizes in the X-axis direction and the Y-axis direction comprises:
correcting the design size in the X-axis direction to one of a (+) X-axis direction and a (−) X-axis direction, if the design size in the Y-axis direction is smaller than the design size in the X-axis direction.

7. The method of claim 6, further comprising:
shifting a position of the beam shot to the other of the (+) X-axis direction and the (−) X-axis direction.

8. The method of claim 1, wherein the controlling of the design sizes in the X-axis direction and the Y-axis direction comprises:
correcting a measured size of the generated beam shot to a (+) X-axis direction or a (−) X-axis direction, and a (+) Y-axis direction or a (−) Y-axis direction, if a design critical dimension (CD) in a first direction and a design CD in a second direction are the same.

9. The method of claim 8, further comprising:
shifting a position of the corrected beam shot to the (+) X-axis direction or the (−) X-axis direction, and the (+) Y-axis direction or the (−) Y-axis direction.

10. The method of claim 1, wherein the determining the correction amount includes tabulating corrected design sizes in the X-axis direction and corrected design sizes in the Y-axis direction.

11. A method of exposure using a variable shaped beam, the method comprising:
measuring design sizes of a beam shot in an X-axis direction and a Y-axis direction, the beam shot being used to expose a circuit pattern;
obtaining measured sizes in the X-axis direction and the Y-axis direction of the generated beam shot;
determining a correction amount of the beam shot, in at least one of the X-axis direction and the Y-axis direction, the correction amount being based on the measured design sizes and the generated beam shot; and
controlling the measured sizes in the at least one of the X-axis direction and the Y-axis direction, on the basis of the correction amount,
wherein the determining the correction amount includes tabulating the correction amount for design sizes in the X-axis direction and design sizes in the Y-axis direction.

12. The method of claim 11, wherein the controlling of the measured sizes comprises:
correcting the measured size in the Y-axis direction if a measured CD difference in the X-axis direction is sufficiently small, on the basis of a CD difference in the Y-axis direction, the X-axis direction being about perpendicular to the Y-axis direction, the measured CD difference in the X-axis being the difference between the measured design size of the beam shot in the X-axis and the measured size of the generated beam shot in the X-axis; and
correcting the measured size in the X-axis direction if a measured CD difference in the Y-axis direction is sufficiently small, on the basis of a CD difference in the X-axis direction, the measured CD difference in the Y-axis being the difference between the measured design size of the beam shot in the Y-axis and the measured size of the generated beam shot in the Y-axis.

13. The method of claim 12, further comprising: shifting a position of the beam shot to one of the X-axis direction and the Y-axis direction.

14. The method of claim 13, further comprising: shifting the position of the beam shot to one of a (+) X-axis direction and a (−) X-axis direction, if the measured size in the X-axis direction of the beam shot is linearly corrected; and
shifting the position of the beam shot to one of a (+) Y-axis direction and a (−) Y-axis direction, if the measured size in the Y-axis direction of the beam shot is linearly corrected.

15. The method of claim 11, wherein the controlling of the measured sizes comprises:
correcting the measured size in the X-axis direction and the measured size in the Y-axis direction on the basis of a measured CD difference in the X-axis direction and a measured CD difference in the Y-axis direction, respectively, if a measured CD difference in the X-axis direction and a measured CD difference in the Y-axis direction are the same, the measured CD in the X-axis being the difference between the measured design size of the beam shot in the X-axis and the measured size of the generated beam shot in the X-axis, the measured CD in the Y-axis being the difference between the measured design size of the beam shot in the Y-axis and the measured size of the generated beam shot in the Y-axis.

16. The method of claim 14, further comprising:
shifting a position of the beam shot to the X-axis direction and the Y-axis direction.

17. The method of claim 11, further comprising:
illuminating a corrected beam shot onto a photoresist layer of a substrate, wherein the controlling of the measured sizes is a non-linear correction.

18. A method of exposure using a variable shaped beam, the method comprising:
measuring design sizes of a beam shot in an X-axis direction and a Y-axis direction, the beam shot being used to expose a circuit pattern;
obtaining measured sizes in the X-axis direction and the Y-axis direction of the generated beam shot;
determining a correction amount of the beam shot, in at least one of the X-axis direction and the Y-axis direction, the correction amount being based on the measured design sizes and the generated beam shot; and
controlling the measured sizes in the at least one of the X-axis direction and the Y-axis direction, on the basis of the correction amount, wherein the determining the correct amount includes tabulating corrected sizes in the X-axis direction and corrected sizes in the Y-axis direction of the beam shot.

* * * * *